United States Patent
Ingman et al.

(10) Patent No.: US 7,321,714 B2
(45) Date of Patent: Jan. 22, 2008

(54) MOISTURE-RESISTANT NANO-PARTICLE MATERIAL AND ITS APPLICATIONS

(75) Inventors: Dov Ingman, Haifa (IL); Vladimir Ogenko, Kiev (UA); Ephraim Suhir, Los Altos, CA (US); Andrew Glista, Annandale, VA (US)

(73) Assignee: ERS Company, Los Altos, CA (US)

( * ) Notice: Subject to any disclaimer, the term of this patent is extended or adjusted under 35 U.S.C. 154(b) by 198 days.

(21) Appl. No.: 10/559,850

(22) PCT Filed: Jun. 13, 2003

(86) PCT No.: PCT/US03/18688

§ 371 (c)(1),
(2), (4) Date: Dec. 7, 2005

(87) PCT Pub. No.: WO2005/005554

PCT Pub. Date: Jan. 20, 2005

(65) Prior Publication Data

US 2007/0036510 A1    Feb. 15, 2007

(51) Int. Cl.
*G02B 6/00*     (2006.01)

(52) U.S. Cl. .................................................... 385/147
(58) Field of Classification Search ............. 313/491, 313/499; 174/52.3; 385/94
See application file for complete search history.

(56) References Cited

U.S. PATENT DOCUMENTS

| 5,414,214 A | * | 5/1995 | Cho et al. ................... 174/539 |
| 5,777,433 A | * | 7/1998 | Lester et al. ................ 313/512 |
| 6,870,311 B2 | * | 3/2005 | Mueller et al. ............. 313/491 |

* cited by examiner

*Primary Examiner*—Quyen P Leung
(74) *Attorney, Agent, or Firm*—Bardmesser Law Group

(57) ABSTRACT

Nano-particle materials including nanometer-scaled particles with a variety of sizes, chemical compositions, and properties may be used to form functional and/or protective media (layers) on a variety of materials and items. Among the items that may be coated and/or protected by nano-particle materials are integrated circuits, printed circuit boards, micro-electro-mechanical systems (MEMS), photonics devices and packages, optical fibers, and displays, as well as various macroscopic structures, such as pipes (tubes), bridges, towers and other civil engineering structures, all kinds of marine vehicles and off-shore structures, aircraft and aerospace structures, cars, etc.

17 Claims, No Drawings

MOISTURE-RESISTANT NANO-PARTICLE MATERIAL AND ITS APPLICATIONS

CROSS-REFERENCE TO RELATED APPLICATIONS

The present application is related to U.S. patent application Ser. No. 09/884,463 (hereafter, "the '463 Application"), which was filed on Jun. 20, 2001 and titled "Optical Fiber with Nano-Particle Cladding". The '463 Application is hereby incorporated herein by reference in its entirety.

This application is a national phase of PCT Application No. PCT/US2003/0018688, filed on Jun. 13, 2003, which is incorporated herein by reference in its entirety.

BACKGROUND OF THE INVENTION

1. Field of the Invention

The field of the present invention includes materials containing nanometer-scaled particles therein, applications for such materials, and methods of forming and/or depositing such materials.

2. Description of the Related Art

Plastic Packages of Integrated Circuit (IC) Devices

Plastic packaging of microelectronic devices has had a major impact on the electronics industry. Plastic-encapsulated microcircuits account today for more than 95% of the worldwide electronics packaging market. More than 40 billion silicon integrated circuits made in the world each year are packaged in plastic.

In recent years, owing to the improved reliability of molding compounds, plastic packages have even gained acceptance for military applications. Plastic packaging is also used for some photonics and opto-electronic applications, when cost-effectiveness is important.

Major reasons for the widespread use of plastics for packaging of micro- and opto-electronic devices include the fact that epoxy molding compounds are low in cost, lightweight, suitable for mass production (because of a high productivity of the molding process), can be based on U.S.-made materials and technologies, and have low dielectric constants. As a result of these advantages, there has been significant recent activity in extending plastic packaging to many non-IC devices and components: optical data inks, un-cooled lasers, light emitting diodes, board-mounted power supplies, magnetic components, etc. Plastic encapsulation is also widely employed today for many other, non- "high-tech" products where substantial cost reduction is needed.

Epoxy-molded plastic packages suffer, however, from many mechanical/environmental disadvantages. Some of these disadvantages have to do with the fact that polymeric materials are moisture-sensitive ("non-hermetic") and, therefore, allow ICs to be affected by ambient moisture over time. Although the reliability of plastic packages of IC devices has improved considerably during the last decade or so, the long-term reliability of plastic IC packages is not as high as is necessary for many applications.

The moisture-sensitivity of the existing molding compounds often results in cracking of plastic packages during their attachment to printed circuit boards by reflow soldering. If removed from hermetic bags and stored for a relatively long time, surface-mount plastic packages have to be "rebaked" dry prior to being surface-mounted on printed circuit boards. It is also typical for such packages to be shipped and to thereafter have to be "rebaked" and "rebagged". This is a costly, and time- and labor-consuming procedure.

When a plastic component is exposed to ambient atmospheric conditions for a substantial amount of time, the component has to be "re-baked" before being surface-mounted onto a printed circuit board. This is an inconvenient and costly procedure. In addition, it has become a concern that physical damage introduced during reflow soldering may compromise a component's long-term performance. It is unclear whether the significant cost of "baking" and "bagging" of surface-mounted plastic packages is always justified. Thus, there is a legitimate concern that because of the moisture-sensitivity of molding compounds, the long-term reliability and overall cost effectiveness of plastic packages of IC devices remains uncertain and might be compromised. Clearly, the cost reduction associated with the merits of plastics might not be as high as necessary, and not as high as it could be if the moisture-sensitivity problem were solved.

On the other hand, hermetic IC packages (e.g., ceramic packages containing less than 5000 ppm of water) also have numerous drawbacks. For example, they are heavy and expensive. Also, they have high dielectric constants, provide problems in the case of large-size packages, and result in lower operational speeds than plastic packages. In addition, in the majority of situations, today's hermetic packages use non-U.S. made materials. This creates supply problems and impacts financial incentives.

Accordingly, there is a need for an IC package material and design that possesses the merits of both non-hermetic (e.g., plastics) and hermetic (e.g., metals and ceramics) packaging materials and hermetic materials without having the drawbacks of each. In other words, there is a strong need for making a plastic package as moisture-resistant as possible.

Underfill Materials

Epoxy-based underfill materials in flip-chip package designs are typically used today to provide mechanical strength to, as well as durability of, the package by protecting the solder joint interconnections from elevated displacements and stresses during temperature excursions. At the same time, the underfill material itself often suffers from insufficient reliability, especially on the long-term basis. This is due primarily to the moisture sensitivity of the epoxy materials used, as well as to their propensity to aging. In addition, the mechanical performance of the existing underfill materials at low temperature conditions might not be acceptable either, because these materials become brittle at temperatures below, say,–50° C. Finally, because the coefficient of thermal expansion of the epoxy materials is temperature dependent, good thermal match between the underfill material and the solder material cannot be achieved in a wide enough temperature range.

Accordingly, there is a need for an underfill material that is hydrophobic, immune to aging, and has a low Young's modulus. Low modulus materials result in low thermally induced stresses in both themselves and in the adjacent materials.

Printed Circuit Boards (PCBs)

The existing structures of printed wiring (circuit) boards use polymer materials, (i.e., materials that are moisture sensitive). Because of that, the lifetime of a PCB is, as a rule, shorter than it would be if the PCB were protected against moisture penetration. In addition, like plastic packages of IC devices, epoxy-based underfill materials, and other electronic polymers, the PCBs are not as reliable, on a long-term basis, as necessary for many applications.

Accordingly, there is a need for a moisture resistant coating for, and/or effective moisture-resistant additives to, currently manufactured PCBs.

Photonic Packages

Hermetic sealing is often required and widely used in aerospace, microwave, biomedical, photonics, and other industries where there is a need to control moisture and/or to provide an inert atmosphere. Hermetic sealing is commonly used when packaging pharmaceuticals, food and beverages, hazardous materials, etc. It is also used when welding under an inert atmosphere (e.g., during titanium welding of aircraft and aerospace components). Hermetic sealing is also required for many photonics components.

Pulsed laser welding has gained wide acceptance in photonics packaging as a reliable material-joining technique. It is an attractive alternative to soldering and adhesive bonding technologies. Laser welding is particularly attractive in applications that demand high strength, reduced manufacturing time, minimal size of the heat-affected zone, accurate positioning of the weld area, and reasonably good long-term stability/reliability of the joint. These qualities are particularly important for light-wave devices that require precise alignment of optical components for an adequate coupling of a light signal.

However, laser welding also has many disadvantages. It is a costly and sensitive process. For example, some laser welding companies charge as much as $250 for the hermetic sealing of a photonics package. Also, the amount of energy absorbed by the metal components in a package during laser welding is affected by many factors that can be neither well predicted nor adequately controlled. As a result, the package's enclosure often gets distorted due to the elevated stresses and deformations induced by laser welding. This can considerably worsen the coupling efficiency or even completely "kill" the optical performance of the device.

In view of the above, there is a need for effective sealing materials and technologies that are low-cost, highly mechanically and environmentally reliable, easy to apply, and that result in low induced stresses and deformations.

Micro-Electro-Mechanical System (MEMS) Devices

The fundamental MEMS technologies are now considered relatively well developed. MEMS device packaging, however, remains a barrier to successful implementation and commercialization of these technologies. A MEMS package is desired to be inexpensive and capable of protecting a MEMS device against contamination, mechanical impact, and harsh environments.

Protecting a MEMS device from contamination at the wafer level is highly desirable. Such protection currently involves an extra fabrication process, in which the MEMS or substrate wafer is bonded to a "cap" wafer, into which appropriate cavities have been etched. Bonding the MEMS and cap wafers together hermetically and providing a vacuum or an inert gas atmosphere within each of the cavities is supposed to create a well-protected environment, which locks out contamination and allows the MEMS parts to move freely inside the cavities.

After the "cap" wafer is bonded to the substrate wafer, MEMS devices can be packaged in much the same fashion as conventional ICs. If MEMS devices are encapsulated before the substrate wafer on which they are positioned is diced and the MEMS chips are "singulated", encapsulation can be carried out while the substrate wafer is the cleanest and the environmental contamination levels are the lowest.

If a MEMS device were robust and if standard packaging methods could be used, then packaging costs and packaging methods would not be substantially different from those associated with packaging of conventional ICs. The existing methods for packaging MEMS devices, however, have at least the following two major shortcomings. First, the silicon cap adds considerable thickness (usually 20 to 40 mils) to a device where the market places a premium on thickness reduction. A typical stack-up for an average MEMS package with a silicon cap results in a package thickness of as large as 120 mils or more. Second, the silicon cap may not be robust enough to protect a MEMS device from the combination of (a) elevated thermally induced stresses arising during normal IC assembly temperature excursions and (b) mechanical stresses arising during standard IC molding processes.

It has been determined that molding processes can exert pressures as high as 250 kpsi on a MEMS device. Though monolithic ICs are usually able to withstand this level of pressure with only slight parameter shifts, this is not necessarily true for MEMS devices. During MEMS device fabrication, a die-attach epoxy is typically used. As this epoxy cures, a thermally induced pressure builds up and acts on the backside of the chip on which the MEMS is formed. The combination of the above-discussed pressures can crack the silicon cap. In fact, failure mode analyses have indicated that silicon caps can be literally crushed by these pressures.

Epoxy materials are prone to outgassing. This is very undesirable for optical MEMS (MOEMS). In addition, these materials become brittle at low temperatures and cannot be used a t high temperatures. Further, these materials age.

Even if a MEMS device does not fail catastrophically under the above-referenced pressures, an assembly warpage typically occurs. An assembly warpage of only one tenth of a mil can cause a problem with many silicon caps. Hence, at least in view of the above, there is a need for an effective hermetic, low-modulus, and low-thermal-expansion material that does not outgas and that performs satisfactorily in a wide temperature range. This would eliminate the above-discussed problems.

Displays

Displays are structurally analogous to MEMS devices, at least in the sense that they may use similar materials, can include a substrate and a cap, or may be comprised of three or more dissimilar materials that have to be glued together, and/or coated with a moisture resistant and/or gas resistant coating. Hence, displays have some problems that are analogous to those discussed above with reference to MEMS devices. However, since the cap layer in a display is typically optically transparent, since a display structure is typically larger and/or is much thinner than a MEMS structure, since a display structure typically has no moving components, since a high degree of tension may be present in the adhesive and/or the coating materials in the display structure, since a display structure typically contains a light-emitting material, since the display structure can be flexible, the challenges that must be addressed for displays are not exactly and not always identical to MEMS device challenges. Nonetheless, in any event, there is a need for hermetic, low-modulus, and low-thermal-expansion materials for displays. There is also a need for materials that do not outgas, are immune to aging, perform satisfactorily (are stable) in a wide range of temperatures, exhibit good functional (optical), mechanical and environmental performance (on both short- and long-term bases), etc. These materials can be used as adhesives and/or as protective coatings. In contemporary (rigid) displays, desiccant material is often introduced into the inner cavity of the display structure to continually absorb moisture that cannot be prevented by the existing sealing materials from being ingressed. In addition, the display structure must provide space to accommodate such a drying agent. But even with this, the reliability of the display is often compromised. This results in higher costs than is desirable and still leaves manufacturers at substantial risk. It is highly desirable, therefore, that the adhesive and coating materials in displays are good enough (in terms of providing adequate long-term hermeticity), so that the application of the desiccant material inside the display structure would not be necessary. This is even more important for flexible displays, in which desiccant materials cannot be easily introduced.

Optical Fibers

An optical fiber operates by transmitting coherent light (e.g., light from a modulated laser diode) down a glass core. Cladding, which is a layer positioned around the glass core, has a lower refractive index than the core, allowing light from a light source to propagate down the core. Around the cladding layer of a conventional fiber is often an overclad layer whose function is primarily related to mechanical protection of the core from external impacts and hazards.

The cladding performs a number of functions. For example, as mentioned above, the cladding performs an optical function in the sense that it provides a medium with a lower index of refraction than the fiber core. In addition, the cladding layer protects the core from environmental hazards (e.g., water, humidity, and moisture penetration). These hazards could lead to initiation and propagation of defects in the fiber, especially when mechanical stresses are applied.

The mechanical stresses result from tensile, bending, twisting, and/or torsion forces and deformations applied to the fiber as the fiber is laid or handled. It is, therefore, generally desirable to have, if possible, a cladding layer with a low Young's modulus. This would enable the fiber to be as flexible as possible. At the same time, it is highly desirable to have a cladding that is hydrophobic to prevent moisture from penetrating through the cladding into the fiber core.

Silica glass is used in the most contemporary light-guides as both the core material (in the form of doped silica) and the cladding material (in the form of undoped silica). Silica glass is also used as the overclad material. However, silica glass suffers from many disadvantages.

One major disadvantage of silica glass is its insufficient fracture resistance, often referred to as "static fatigue". This means that, in silica glass, there is only a finite time interval between when an appreciable thermal or mechanical load is applied to the fiber and when delayed fracture occurs. Another disadvantage of silica glass is its moisture sensitivity. Even a very minute amount of moisture on the fiber surface can result in its sudden failure, especially in the presence of surface micro-cracks and tensile stresses. Yet another major disadvantage of silica glass is its inability to withstand appreciable deformations due to tension or bending.

External (protective) coatings are also often applied on the top of the vulnerable silica material. These coatings can be either non-hermetic (e.g., polymer) or hermetic (e.g., carbon or metal). Polymer coatings generally have fairly low Young's moduli and are able, therefore, to withstand large tensile or bending deformations. Polymers, however, absorb moisture and can be dimensionally or compositionally degraded. Thus, the long-term reliability of a polymer-coated fiber is often compromised.

Hermetic coatings provide good protection from moisture, but are subject to corrosion. In addition, they have high Young's moduli. This results in poor performance of the light-guide when mechanical forces (axial, bending and/or twisting) are applied. Phosphorous nickel, for example, has a Young's modulus that is approximately three times higher than the Young's modulus of the silica glass. It is not uncommon, therefore, for a hermetic coating to fail before the silica material fails when subjected to mechanical loading.

Accordingly, in optical fiber engineering, there is a need for a cladding/coating material that has a low Young's modulus, good mechanical reliability, and environmental stability. There is also a need for a material that is hermetic (hydrophobic), so as to prevent moisture from penetrating into the fiber.

SUMMARY OF CERTAIN EMBODIMENTS OF THE INVENTION

The present invention is directed to materials and layers that include nano-particles that substantially obviate one or more of the problems due to the limitations and disadvantages of the related art. The present invention is also directed at methods of forming and depositing materials and layers of nano-particle materials (NPMs) on a variety of items and materials in order to obviate one or more of the problems due to the limitations and disadvantages of the related art. The present invention is also directed at a variety of items that include NPM coatings that obviate one or more of the problems due to the limitations and disadvantages of the related art.

According to one embodiment of the present invention, an integrated circuit (IC) is provided wherein the IC includes a substrate (or a lead frame) with a first surface and a nano-particle material (NPM) positioned adjacent to the first surface. This NPM can be used as an effective substrate for the existing epoxy-based die-attach materials. The NPM is a low-modulus, yet hydrophobic, material and can be applied in a much thinner layer than epoxies. In addition, it can fill in small cracks, if any, in the chip-and in the substrate, thereby arresting the cracks.

If there is a need, the NPM's matrix can be filled in with thermally conductive particles, and/or metal nanoparticles can be used to improve the thermal conductivity of the die-attach material. This conductivity is supposed to be much better than in regular (thick) die-attach adhesives because of the significantly smaller thickness of the NPM layer (e.g., on the order of just one micron) in comparison with the presently used die-attach epoxy-based adhesives.

According to another embodiment of the present invention, a NPM can be added to the standard (i.e., currently) used adhesives, thereby improving their hydrophobic and other properties.

According to another embodiment of the present invention, a method of forming a well-protected integrated circuit is provided. This method includes the step of manufacturing an integrated circuit on a substrate (or a lead frame) and the step of positioning (i.e., placing) a nano-particle material adjacent to the integrated circuit. This NPM is supposed to conformably coat the IC, thereby providing a thin moisture resistant coating over the IC. The NPM-coated die/substrate (or a lead frame) assembly is epoxy-molded into a plastic package.

According to another embodiment of the present invention, the NPM is added to the molding compound, thereby improving its hydrophobic properties.

According to another embodiment of the present invention, the NPM is used to conformably coat the entire plastic package, thereby providing a moisture-resistant layer that prevents the outside moisture from penetrating the package. If an NPM is employed, "baking" and "bagging" or "rebaking" and "rebagging" the plastic packages of IC devices might not be needed.

According to yet another embodiment of the present invention, an optical device is provided. This optical device includes an enclosure (e.g., of the "butterfly" package type) with an opening, a photonic (e.g., laser) device positioned within the enclosure, a lid positioned to cover the opening, and a nano-particle material that attaches the lid to the enclosure.

Accordingly to yet another embodiment of the present invention, an epoxy material whose hydrophobic properties can be provided by NPM additives, can be used to attach the lead to the enclosure.

A further embodiment of the present invention provides for a method of making an optical device. The method includes the steps of positioning a photonic device in an enclosure that includes an opening, placing a lid on the opening, and forming a hermetic NPM-based seal between the lid and the enclosure.

According to another embodiment of the present invention, a micro-fabricated structure is provided. This micro-fabricated structure includes a substrate having a first surface, a micro-fabricated device positioned on the first surface of the substrate, an intermediate layer with a first surface and a second surface, a cover positioned adjacent to the second surface of the intermediate layer, a first nano-particle material layer positioned between the cover and the second surface of the intermediate layer. According to this embodiment, the first surface of the intermediate layer is located opposite the second surface of the intermediate layer, the first surface of the intermediate layer is positioned adjacent to the first surface of the substrate, and the intermediate layer substantially surrounds the device.

According to yet another embodiment of the present invention, a method of forming a micro-fabricated structure is provided. This method includes the step of micro-fabricating a device on a substrate that structurally supports the device, an intermediate layer that substantially surrounds the device, and a cover that is positioned adjacent to the intermediate layer. This method also includes the step of hermetically sealing the device between the substrate, the intermediate layer, and the cover.

According to yet another embodiment of the present invention, an optical fiber is provided. This fiber includes a core and a moisture resistant NPM-based cladding (i.e., a "smart" composite material/structure) around the core. The cladding/coating layer consists of an inner layer adjacent to the core and an outer, advanced-polymer-material-based layer. The inner layer is comprised of clusters of nanoparticles and, possibly, can contain hollow or solid microspheres. Optically, it serves as an effective cladding layer, owing to its very low (e.g., next to unity) refractive index. Mechanically, it provides a kind of bearing-type of layer, in which the nanoparticles play the role of the bearing balls. This allows the outer layer to slide with respect to the surface of the core without producing appreciable stresses. This capability reduces dramatically the likelihood of building up substantial thermally-induced and/or mechanical stresses. Therefore, actually, any suitable polymeric material can be used as an outer layer of the cladding in question, since its thermal expansion/contraction mismatch with the fiber core will be accommodated (buffered) by the bearing-like inner layer. Similarly, any appreciable mechanical deformation in tension, bending, or torsion, applied to the outer layer, will be accommodated by the bearing-like inner layer.

According to another embodiment of the present invention, the above-described bearing-like NPM-based layer can be applied on the surface of any light-guide, including all-silica and all-polymer light-guides, to provide an effective thermal/mechanical stress-compensating layer.

According to another embodiment of the present invention, this above described bearing-like (NPM-based) composite structure can be applied to any structure made of dissimilar materials and experiencing a change in temperature, or to any structure experiencing temperature gradients, or to any structure subjected to mechanical deformations, when there is a need to provide adequate strain buffering for lower induced thermal and/or mechanical stresses.

According to another embodiment of the present invention, an appropriate modification of the NPM can be added to a polymer cladding of a light-guide with a silica or polymer core to improve its optical and/or mechanical and/or environmental properties.

According to another embodiment of the present invention, an appropriate modification of the NPM can be used to construct a hermetic, yet low modulus, protective coating of a light-guide.

According to another embodiment of the present invention, NPM-based additives can be incorporated into a conventional coating material in order to improve its optical, mechanical or environmental properties.

According to yet another embodiment, a method of protecting a macroscopic structure of any size and use is provided. This method includes preparing an appropriate modification of a nano-particle material and forming an NPM-based layer by depositing the nano-particle material on a surface of the macroscopic structure. The structure could be either metallic or non-metallic or a combination of both. In the case of a metallic structure, the NPM protects it against corrosion. In the case of a non-metallic structure, it protects it from moisture, aging, cracking, etc.

Features and advantages of the present invention will be set forth in the description which follows, and in part will be apparent from the description, or may be learned by practice of the invention. The objectives and other advantages of the invention will be realized and attained by the structures and methods particularly pointed out in the written description and claims hereof as well as the appended drawings.

It is to be understood that both the foregoing general description and the following detailed description are exemplary and explanatory and are intended to provide further explanation of the invention as claimed.

DETAILED DESCRIPTION OF CERTAIN EMBODIMENTS

Certain types of nano-particle materials (NPMs) have previously been disclosed in the '436 Application. Generally, NPMs have applications where high functional performance, high mechanical reliability, and/or high environmental durability are highly desirable and/or required. Among the possible uses for NPMs are as coatings and protective layers on either organic or inorganic items (e.g., objects, surfaces, devices, assemblies, and structures). When used to protect items such as, but not limited to, ICs, photonics packages, MEMS devices, displays, and optical fibers, NPM-based coatings and layers address one or more of the problems caused by the limitations and disadvantages of the related art.

In general, a NPM includes nanometer-scaled particles and, optionally, a filler and/or matrix. When desired, particularly for some optical applications, micrometer-scaled particles are also included. A NPM may be specifically designed or "customized" for a particular application or use. Hence, the NPM can be designed for and the properties of NPMs may be varied over a very wide range, depending on the requirements of/for the particular application.

According to certain embodiments of the present invention, NPMs and NPM layers are made to be moisture-resistant. Moreover, the NPM-based composites can possess the property of active hydrophobicity. This means that the NPM layer can be "constructed" in such a way that its inner layer (i.e., the layer adjacent to the surface to be protected) can be made hydrophobic.

Liquid water cannot get through gaps (cracks) that are thinner than 0.1 micron if the walls of the gap are hydrophobic. Since many NPM nano-particles are chosen to be substantially smaller than 0.1 micron (i.e., on the order of tens of nanometers), water particles are unable to get through gaps between the hydrophobic nano-particles in a NPM layer that acts as a continuous hydrophobic layer in spite of gaps between particles. Water particles penetrate materials through capillary channels in the materials. If, however, nanoparticles have a hydrophobic (moisture resistant) surface, the water aggregates ("clusters") in tiny droplets of close-to-spherical shape. If it is impossible to push such droplets through the narrow gaps between the particles, the NPM-based layer possesses hydrophobic properties despite the existing gaps between the particles.

Thus, an item coated with such a hydrophobic NPM layer is highly resistant to water (moisture). NPM-coated items also have highly improved mechanical reliability, as well as a highly improved environmental durability. Mechanical reliability may be increased over a wide range of mechanical loading conditions, pressures, etc., depending on how the NPM is designed. Environmental durability may be increased over a wide range of humidities, temperatures (e.g., between approximately −250° C. and 400° C.), and other environmental conditions. It is noteworthy that non-modified (hydrophilic) silica particles are stable up to 700° C. and modified (hydrophobic) silica particles are stable up to 350° C. Low and even extremely low temperatures (up to approximately −250° C.) do not cause any damage to either type of nanoparticles.

According to certain embodiments, a NPM is designed to have a low Young's modulus and to be hydrophobic. According to other embodiments, a NPM is designed to possess many other application-specific and beneficial characteristics such as, but not limited to, a low index of refraction (having a value very close to unity), good thixotropic properties, etc.

The nano-particles in a NPM may include, for example, at least one of a ceramic, silica, molybdenum disulfide, Teflon, a metallic oxide, a layered alumosilicate system, graphite, carbon nanotubes, and inorganic oxide materials. The metallic oxide may include, for example, at least one component of titanium oxide, aluminum oxide, and magnesium oxide.

If a filler is used in conjunction with nano-particles to form a NPM, the filler may be either polymerizing or non-polymerizing. Other fillers, which may be used include, but are not limited to, at least one of synthetic oil, a polysiloxane, Teflon, a fullerene, a fulleride, and a fulleren-containing material.

The density of the nano-particles within the filler can be chosen in such a way that it affects the filler and/or matrix material viscosity and Young's modulus in the desirable way (direction). In other words, the viscosity and Young's modulus of the filler can be modified to match the requirements of a particular application.

When micrometer-scaled particles are used as part of a NPM, these particles may be solid, hollow, and/or porous. Furthermore, the geometric shape of these particles is not restricted. When hollow, solid, and/or porous micro-spheres are added to a NPM, these micro-spheres may contain, if necessary, various functional reagents (reactive substances).

A NPM protective layer that includes nano-particles that are substantially evenly and/or randomly distributed within the layer is within the scope of present invention. In addition, a composite protective layer that includes one or more NPM layers is also within the scope of the present invention. The NPM layers in such a composite layer may have different hydrophobicity characteristics and, according to certain embodiments, non-NPM layers (e.g., resin foam layers) may be included in the structure.

According to certain embodiments of the present invention, an NPM-based composite protective layer may include one or more inner layers of metallic oxide nano-particles and one or more outer layers of silica nano-particles. According to other embodiments, an NPM-based composite structure includes outer layers with inner portions that contain molybdenum disulfide nano-particles and outer portions that contain Teflon and/or metallic oxides.

According to certain embodiments, an NPM-based layer is protected by one or more additional layers. These additional layers, which typically provide additional protection from either the environment or external forces, may be positioned around, adjacent to, or in direct contact with the NPM layer and may include organic and/or inorganic materials.

A NPM-based layer may be formed to be water-resistant but to allow gases, including water vapor, to penetrate the layer and to be transported there through. In some applications (cases) an NPM-based layer having such non-hermetic sealing properties may be desirable for keeping the barometric pressure substantially equal on both sides of a structural element protected by the NPM layer. Such a gas-permeable sealer layer may be needed to reduce the amount of deflection of the element, thereby increasing, for instance, its fatigue life.

When it is desirable to make a NPM layer function as a hermetic seal that is resistant to the penetration of gases, including water vapor, special hydrophilic components (e.g., hydrophilic particles) may be included in the layer. These components typically have relatively large specific surfaces that facilitate vapor condensation. Hence, these components are intended to "convert" water vapor (that comes into contact with the hermetic seal) into liquid water. Then, hydrophobic components in another portion of the layer act as a water-resistant barrier. The above-described hermetic seal is not permeable either by water, water vapor, or any other gas or vapor. To form a sealing layer, the NPM may contain flaky stratified components (e.g., mica flakes, molybdenum disulfide, graphite flakes etc) which, when wetted, can stick together and create a fish-scales structure. Then, one can expect rather effective resistance to the water vapor and to penetration of other gases through such a structure.

A NPM may include nano-particles (e.g., silica nano-particles) whose surfaces have been modified. Examples are surface hydroxyl (OH) groups that have been substituted with methyl ($CH_3$) groups. According to other embodiments of the present invention, a NPM layer may be formed on a surface of an item after this surface has been modified by a similar substitution of hydroxyl groups for methyl groups.

The above modification causes hydrophobicity of the modified surfaces. Hence, if the surface of an item is modified, or if the surfaces of particles immediately adjacent to, or in direct contact with, the surface of an item to be protected have been modified, water vapor molecules cannot reach the micro-cracks that may pre-exist on the surface of the item. This is due to the fact that the water vapor cannot create a stable liquid film in this center, because such a film would be desorbed very fast, and, therefore, the vapor cannot actually "harm" the silica glass or any other protective surface. Owing to this, water molecules cannot initiate glass stress corrosion in the item. Thus, the presence of the modified nano-particles and/or the appropriate modification of the surface of an item provide additional environmental and mechanical protection to the item.

A NPM can be designed to be thixotropic, meaning that it possesses a "self-healing" ability and is capable of restoring its continuity and properties after being damaged. A thixotropic NPM typically includes nano-particles that are only several tens of nanometers in size. Such nano-particles typically have an extraordinary penetrating ability, have the ability to fill-in even tiny cracks on surfaces, and are capable of preventing the propagation of such cracks (i.e., are able to "arrest" the cracks). Therefore, if a thixotropic NPM is damaged, nano-particles within such a NPM are capable of "filing-in" the damage and "healing" the material. The nano-particles of a thixotropic NPM layer can also fill-in and arrest cracks on surfaces that are immediately adjacent to or in direct contact with the layer. Hence, a thixotropic NPM layer can be used to protect brittle materials such as, but not limited to, glasses, ceramics, polymeric materials, semiconductors, etc.

A NPM layer may also be viewed as having a kind of a thixotropic quality during the manufacturing of an item. For example, a NPM layer can "heal" the adverse effects of undesirable phenomena that arise during manufacturing (e.g., temperature fluctuations, stress fluctuations, etc.). More specifically, the nano-particles in a NPM layer may be designed to swiftly fill-in any gaps or voids that develop on the surfaces of an item being fabricated as a result of deformations applied to the item during manufacturing processes.

A NPM layer may be designed to behave as a "bearing layer" that allows a (first) surface on one side of the layer to "slide" relative to a (second) surface on another side of the layer. If surfaces on opposite sides of a "bearing layer" include materials that have a considerable thermal expansion or contraction mismatch, the "bearing layer" can successfully allow the surfaces to slide relative to each other without building up any significant stresses or deformations in the structure. Such a property is useful, for example, when the layer is used as a protective coating and/or cladding in an optical fiber. Under such circumstances, a NPM cladding positioned between a silica core and a protective coating (e.g., a coating that includes an acrylic, a polyamide, etc.) can allow the coating to "slide" along the silica core without causing any stress-related damage. These nano-particles within the disperse medium (polymer) penetrate into cracks and create many inter-molecular bonds on the interface surfaces of the cracks. Nano-particles serve to "patch to the wound", preventing further crack propagation, and providing another channel of "escape" for the mechanical energy released during the crack generation as an alternative to crack growth. This energy can be redirected to the chemical reaction of covalent bond generation (e.g., to promoting the "sticking" and/or "gluing" of nano-particles to the damaged zone).

Another application for a NPM layer is as an adhesive layer between adherend surfaces. The adhesive strength of a NPM in an assembly where the NPM acts as the adhesive has been found to be very good, especially if the NPM is applied as a very thin layer (e.g., with a thickness of one or two microns) on a smooth (e.g., polished) surface. The adhesive strength of an NPM-based adhesive is due primarily to its high strain-at-failure rather than to its high stress-at-failure. Such an adhesive strength is considerably different than the adhesive strength of conventional (e.g., epoxy) adhesives. However, this difference is acceptable in the majority of applications, especially when the maximum thermal mismatch strain has a finite value. This strain is, actually, the product of the difference in the coefficients-of-expansion of the adherend materials, $\Delta\alpha$, and the temperature change, $\Delta T$. The adhesion strength can be defined, for instance, as specific energy per unit area needed to separate adhered surfaces. This parameter ("strength") can be controlled by the chemical modification of the nano-particle surfaces, the density (number of particles per unit volume), their sizes, etc. The smaller the particle, the higher is the surface-to-volume ratio, and, therefore, more adhesive inter-molecular contacts-bonds are created for the same mass (weight) content of the nano-particles. It is very similar to the forces acting in supra-molecular systems, in which weak inter-molecular bonds provide high strength of coupling-cohesion and interaction, due to the huge number of particles and bonds.

The nature of the above-indicated good "adhesion strength" of the NPM can be described by a model that defines several sub-layers or portions within a NPM layer. According to this model, the peripheral (i.e., "outer" or "extreme") sub-layers of the NPM layer provide very good adhesion to the surfaces which they are adjacent to and/or are in contact with. The "inner" portions or sub-layers, on the other hand, enable the adjacent surfaces to "slide" with respect to each other.

Dependent upon the amount of adhesion desired, hydrophobic nano-particles may be included in the NPM layer to either improve or degrade the adhesion between the NPM layer and adjacent surfaces. The type and amount of change in the adhesion generally depends upon the particular application, the physics of the adjacent surfaces, etc.

When, for example, a NPM layer is used as a cladding on the surface of a glass optical fiber, the adhesion between the NPM layer and the fiber surface can be made poor by choosing nano-particles that are of the same charge as the charge on the fiber surface and by distributing these nanoparticles throughout the NPM layer. This type of structure ensures that mutual repulsion exists between the fiber surface and the nano-particles. If desired, the poor adhesion may be distributed along the entire core of the fiber. It should also be noted that the amount of mutual repulsion could be increased by charging the particles and/or the fiber surface as the NPM layer interacts with an outer coating such as, but not limited to, Teflon, polyethylene, polyamide, and special adhesive compositions. It is noteworthy that charged particle systems tend to create structures, which correspond to the minimum potential energy under the given thermodynamics constraints. Unfortunately, charges on the particles can migrate. If one wishes to use stable charged particle systems, he/she has to apply materials, which are known as electrets. For instance, polymer particles can be made electrets. These electrets have pre-designed point defects to "trap" charges. Such charges are positioned, as a result of action of these defects, beneath the surface. This can prevent charge migration and its extraction from the system by a "would-be" external attraction.

If there is a need, for one reason or another, to delay the onset of the hydrophobicity and/or other NPM properties (e.g., viscosity), this delay could be achieved by adding spirit (e.g., white spirit) to the NPM mixture before this mixture forms the "final" NPM. Such an addition can also "paralyze" the hydrophobic property of a previously formed NPM for a desired period of time (e.g., until the required adhesion is achieved).

A delay in the onset of hydrophobicity may be desirable when, for instance, the NPM is to be used as an adhesive and the interfacial surfaces of the "adherends" in a structure have been cleaned, but have not yet dried. In such situations, an "instantaneously" strong hydrophobicity of the NPM adhesive could become an obstacle to good adhesion to the surfaces of the adherends. In such a situation, the delay in the NPM hydrophobicity can promote the development of good adhesion between the adhesive and the adherend. There is typically some absorbed water on the surface subjected to treatment (i.e., the surface intended to be protected). When an NPM composite containing alcohol is applied, the transition of this water into the system occurs, creating an azeotropic mixture. At this stage the surface is able to get wetted and to absorb other ingredients of the mixture, but as the alcohol is evaporating, and the particles hydrophobicity is restored, the surface becomes hydrophobic. The water cannot return to (i.e., get in contact with) those centers that were responsible for its previous absorption, so the previously absorbed water is expelled from the surface and, eventually, from the system.

By combining within the same NPM, hydrophilic and hydrophobic nano-particles (e.g., silica nano-particles) with a filler or matrix (that is typically chosen to be hydrophobic), a "smart" NPM can be formed. Different types of "smart materials" can be formed by varying the combinations and/or percentages and/or types of the hydrophilic and hydrophobic nano-particles in the filler material.

According to certain embodiments of the present invention, the "smart material" is hydrophobic enough to keep out environmental moisture and, at the same time, is actively hydrophilic enough to absorb and subsequently expel moisture that was already ingressed in the material. It has been established that when, for example, the ratio of hydrophilic-to-hydrophobic nano-particles in the NPM is between 20%-to-80% and 80%-to-20%, the smart material is capable of this type of behavior. If the ratio of hydrophilic-to-hydrophobic nano-particles in the NPM is between 40%-to-60% and 60%-to-40%, this type of behavior may also be exhibited.

The viscoelastic properties of a smart material can be controlled, at least in part, by the density and nature of the nano-particles and filler/matrix. A smart material may also be designed to have a very low Young's modulus, very high strain-at-failure, and/or a low coefficient of thermal expansion (CTE). A smart material may also be designed with a CTE that is extremely low if, for example, the material will be used to adhere low CTE materials such as, but not limited to, silicon, glass, ceramics, Kevlar, Kovar, and Invar. Like other NPMs, a "smart" NPM may adhere very well to adjacent materials which it covers (protects). In addition, a "smart" NPM may have a very long (practically unlimited) service life, since it is not prone to corrosion, aging, or crack and micro-crack initiation. Further, a NPM smart material may also possess the above-discussed and highly-desirable property of thixotropy. This property allows the NPM smart material to restore its properties when a micro-crack attempts to initiate as external mechanical loads are applied.

Like more general NPMs, a NPM smart material may also be able to "heal" an item that it coats (e.g., a silica glass fiber core, a chip in a plastic package, etc.). As has been discussed above, this is due, at least in part, to the fact that the nano-particles in a smart NPM can fill-in (or penetrate into) the defects, pores, cracks, micro-cracks, and voids that may exist or that may be initiated in the material covered (protected) by the NPM smart material.

A smart NPM typically has the ability to absorb mechanical energy in much the same manner that more general NPMs absorb mechanical energy. This ability becomes particularly important when the NPM smart material is used to coat and to protect surfaces of items such as, but not limited to, portable electronics, micro- and opto-electronic components and devices used in marine vehicles, and aircraft structures, which are often subjected to mechanical shocks and vibrations.

A number of methods has been developed for forming, manufacturing, and/or modifying NPM coatings or layers on items such as, but not limited to, surfaces, structures, objects, and devices. According to a first method, the surface to be coated and/or protected by a NPM layer is electrically charged using static electricity. The surface is then exposed to an atmosphere that is saturated with nano-particles. According to this method, sedimentation of the nano-particles onto the surface may occur, with smaller-diameter particles sedimenting out first, followed by sedimentation of a mixture of larger-diameter particles and small-diameter particles. If different layers of different types of nano-particles are desired, this step may be repeated.

Following sedimentation, for a short period of time, an electrically conductive polymer (e.g., a polymer which contains acetic acid) is applied to the surface of the item being coated. Next, a layer of NPM smart material is formed on the surface of the electrically conductive polymer. Then, the entire structure, which is typically wetted by another layer of electrically conductive polymer, is introduced into an alternating electromagnetic field (e.g., a RF or microwave field) in order to generate or induce electrical currents inside the wetted polymer layer. The generation of electrical currents in the wetted polymer layer speeds up the polymerization thereof and enhances water evaporation therein. According to certain embodiments, the process of inducing electrical currents inside the wetted polymer layer is tailored in such a way that the intensity of the electrical currents drop to zero when full polymerization finally takes place.

According to certain embodiments of the present invention, no filler material is used and only electrostatic adhesion between nano-particles is relied upon to form a NPM layer. Typically, the nano-particles used to form such layers are manufactured by any number of methods known to those skilled in the art (e.g., grinding and various chemical methods). Once the nano-particles have been formed, an item such as, but not limited to, a light-guide with a negatively charged silica core is coated with a NPM layer having two dissimilar nano-particle layers (e.g., positively-charged metal oxide nano-particles and an outer cladding of negatively-charged silica nano-particles). In this type of structure the layer on the surface of the item is structurally stable due to the static charges "trapped" in the nano-particles.

According to the second method for forming a NPM or NPM layer, the following steps can be undertaken:

A 0.5-1.0% water-glycerin solution is prepared. Alternatively, an alcohol or organic solvent-polymer solution or colloidal acetic acid-based raw polymer solution may be used. Two basic types of liquids can be used for the preparation of special NPM versions. One type includes aqueous liquids and the other includes hydrophobic liquids. The first type requires a special way for hydrophobic particles to be introduced (brought in). A 0.5-1.0% water-glycerin solution may be prepared when hydrophobic particles are to be introduced into this aqueous medium. Alternatively, an organic solvent-polymer solution or a colloidal acetic-based raw polymer solution may be used for non-aqueous hydrophobic-based NPMs to control the NPM rheology.

It should be noted that glycerin (a type of alcohol) can be easily dissolved in water and, at the same time, may function as a bridging element to a hydrophobic surface, allowing for the introduction ("insertion") of hydrophobic nano-particles. Alcohols are useful because they allow for the creation of mixtures of materials that otherwise have difficulty in existing as a mixture, even temporarily. Thus, a number of alcohols or spirits can be used to delay the development of hydrophobicity in subsequently formed NPMs by nano-particles, including hydrophobic particles, which are brought in into the prepared liquid. Such solvents (and mixtures thereof) replace capillary water in a NPM structure after such a structure is formed. These solvents may be later removed, along with the residual moisture, by employing adequate processes, such as, but not limited to, azeotropic evaporation with high-frequency heating.

Hydrophobic nanoparticles may be placed into the prepared water-glycerin solution and may be blended in a high-speed blender with a high vacation rate. This enables one to create a highly heterogeneous water-air (water-glycerin-air) medium (or foam) containing the desired/required density of nanoparticles (nanosolids). A "foam" in this context is at least a two-phase system. In this system, one phase is the dispersed phase, which could be air, or gas, or a predetermined gas mixture, etc. According to certain embodiments, a plurality of gaseous phase cells, separated by thin films of liquids or liquid/solids mixtures can be used. The bubbles create dispersion with high gas volumetric content.

The above-discussed water droplets often function as small elastic balls, which provide additional protection from external environmental hazards, particularly under elevated pressure. More specifically, deformed water droplets surrounded by nano-particles often block possible paths to the surfaces upon which a NPM or NPM layer is to be formed. Hence, the droplets substantially prevent any contact with aggressive external environmental hazards.

Pursuant to the above-described solution being prepared, the medium (i.e., the material to be protected and treated) is typically not entirely free of water. Rather, this material may contain some absorbed water on its surface. However, a small amount of water may remain in the spaces of the highly dispersed hydrophobic medium containing hydrophobic nanoparticles without causing any adverse effects. Typically, the water remaining in the medium is in the form of small droplets that are covered by a thin layer of hydrophobic nanoparticles. Hence, the water droplets cannot cause any harm to the surfaces (e.g., silica glass surfaces), upon which a NPM (NPM layer) is to be formed.

The surface to be protected by a NPM or NPM layer is then immersed in the water-air-glycerin foam and may remain in the solution for between approximately 20 and 40 seconds to be exposed to the alcohol or organic solvent-polymer solution or colloidal water-glycerin-air solution containing the nano-particles.

The wetted surface may then be exposed to microwave radiation. The water absorbs the microwave radiation, causing rapid azeotropic evaporation. This, in turn, is followed by an expulsion of the nano-particles out of the water and the organic solvent. Then, clustering typically occurs on the surface to be protected.

When forming a NPM or NPM layer in this manner, a polymer layer is formed on the surface to be protected and a nano-particle "solid layer" formed on or around the polymer layer. The overall structure is mechanically stable, elastic foam that prevents or decreases the danger of impact failure. In the foam, the combined effect of the polymeric film and the hydrophobic nano-particles results in adequate environmental protection for the surface of the item. The above-described treatment, however, provides a change of the elastic and optical properties of the foam and increases the porosity of the foam on the protected surface. The above description generally corresponds to the situation when the NPM is used primarily as a coating (sealing) material and where the optical characteristics of the material are of relatively low importance. In the case when the NPM is used as a cladding, the above "solid layer" is typically positioned adjacent to the core and the polymer layer to be formed on the top of it or around it.

An advantage of bringing in (inserting) the hydrophobic particles in aqueous media is that these particles, as a result of entering into gas/air bubbles of the foam, prevent these bubbles from collapsing/closing due to the presence of the hydrophobic component. This provides a long-term, structurally stable structure with a pre-programmed porosity. This structure contains a continuous interconnected liquid/aqueous film, which can transform water vapor into water. The voids can absorb water and cause other gaseous components attempting to penetrate the medium in question to accumulate (i.e., the voids function like "traps").

According to another method for manufacturing (forming) a NPM, a paste that contains a polymer and nano-particles is formed. Then, a surface (e.g., the surface of a substrate or fiber core) is drawn through the paste such that a film of paste sticks to the surface to be protected. Finally, the paste is cured and/or solidified to form an adequate NPM on the surface.

In a very general sense, metals (which are prone to corrosion), polymer materials (which are moisture-sensitive and prone to aging), and ceramics and glasses (which are prone to crack initiation and propagation), can all benefit from the materials and methods discussed herein, and modifications thereof. Hence, any item that includes a metal, and/or a polymer, and/or a ceramic, and/or a glass can benefit from the NPM-based materials and methods discussed herein.

Though the structures of only a few items are discussed herebelow with reference to how NPM-based technology may be used in conjunction therewith, it should be appreciated that many other items, which are not expressly listed below, are also within the scope of the present invention. For example, items that could benefit from highly effective protection against moisture or water penetration, and/or high water repellency characteristics, and/or high mechanical reliability, and/or high environmental durability of the design are within the scope of the present invention. Also, items that would benefit from the inclusion of a material that can act as a carrier with a high penetrating ability are within the scope of the present invention. It should also be appreciated that, in the discussion herebelow, the term "NPM" will refer generally to NPMs (including those made up exclusively of nano-particles and those that include other materials, such as fillers), NPM smart materials, NPM layers, and NPM smart material layers.

Optical Fibers

Any of the above-discussed materials, layers, and methods, and variations thereof, may be used to protect and/or enhance the performance of optical fiber structures and/or to form optical fiber structures according to embodiments of the present invention. For example, an optical fiber that includes a doped silica glass core, an undoped silica glass cladding layer, and an NPM-containing over-cladding layer that hermetically seals the core and the cladding is within the scope of the present invention. As another example, an optical fiber with an NPM-containing over-cladding that provides improved mechanical reliability to the fiber by having a low Young's modulus is also within the scope of the present invention. As yet another example, an optical fiber having a core (e.g., a silica glass core), a cladding around the core (e.g., a silica glass cladding), a protective layer around the cladding (e.g., a plastic protective layer or sheath), and an overcladding that is positioned between the cladding and the protective layer is also within the scope of the present invention, particularly if the overcladding layer includes a NPM and allows for the protective layer to slide with respect to the cladding without experiencing plastic deformation.

Plastic Packages of Integrated Circuit (IC) Devices

The above-disclosed materials, layers, and methods, and variations thereof, may be used in the manufacture of hermetically sealed plastic electronic packages for IC devices. These packages, which often include at least a substrate on which an IC is formed, a NPM, and a plastic layer to protect an IC, benefit from all of the advantages of traditional plastic package technology (e.g., cost-effectiveness) but eliminate such shortcomings of the traditional technology as moisture-sensitivity and insufficient long-term reliability. Also, the use of a NPM in a plastic package eliminates the need for re-baking and re-bagging of an IC after an IC gets exposed to ambient conditions and/or humidity.

According to certain embodiments of the present invention, an NPM-containing plastic package is formed over an IC device by first covering the IC with a NPM. In other words, the NPM is typically in direct contact with the IC and at least a portion of the substrate on which the IC is formed. In those embodiments where the NPM merely adjacent to the IC and a portion of the substrate, intermediate layers (e.g., layers that enhance IC protection and/or promote adhesion) may be present between the substrate and the NPM. Once the NPM is in position, a plastic layer is formed to cover the NPM and the IC. This plastic layer is typically formed by curing one of the epoxies that are known and commonly used in the art of IC packaging.

In alternative embodiments, a NPM is added to a plastic-forming compound or epoxy before the compound is cured. Then, after the compound or epoxy is positioned to cover the IC and is cured, the resultant NPM-containing plastic packaging is moisture-resistant and protects the IC from ambient conditions.

According to other alternative embodiments, the outer surface of a packaged IC device may be coated with a NPM after a plastic packaging has been formed over the IC. These embodiments are able to block out moisture and/or traces of moisture from the surface of the packaging material. These embodiments are also able to fill-in surface cracks in the plastic packaging, thereby arresting crack propagation therein.

In order to form a hermetically packaged IC according to one exemplary method of the present invention, an IC is manufactured or formed on a substrate. Then, a NPM is positioned or formed at a location adjacent to the IC. This NPM may either be formed to be in direct contact with the substrate or intermediate layers may separate the NPM from the substrate. Either way, the NPM typically is designed and positioned in a manner that substantially prevents moisture from interacting with the IC. This layer may also be designed and positioned in a manner that prevents moisture from reaching the substrate.

Photonics Packages

The above-disclosed materials, layers, and methods, and variations thereof, may be used in the manufacture of photonics packages. NPMs can provide hermetic seals in photonics packages and can also provide seals that are able to reduce thermally induced internal stresses in photonics packages.

Many photonics packages may be thought of as boxes or enclosures, typically of a rectangular shape, that have lids and that enclose photonics devices. A representative enclosure includes an opening on one side thereof that allows for an optical or photonics device to be placed or formed within the enclosure. Once the device is positioned or formed within the enclosure, the lid is positioned over the opening to cover the opening and fully enclose the device within the package or enclosure. When an NPM is included, the NPM is typically used as an adhesive layer or binder that attaches and/or secures the lid to the enclosure and provides a hermetic seal between the lid and the box of the photonics package.

The NPM can be very flexible or compliant. If a flexible or compliant NPM is used, the lid is not rigidly connected to the box. Hence, if the lid and box are made from different materials and are heated, the NPM can act as a "bearing layer" that allows for sliding of the lid relative to the box, thereby maintaining the hermetic seal and substantially eliminating thermally-induced stresses and plastic deformation due to the thermal expansion mismatch of the materials.

According to certain embodiments of the present invention, the optical or photonic device is chosen to be a laser and the enclosure is chosen to be a butterfly package. Also, according to certain embodiments, the NPM is chosen to have a low Young's Modulus (e.g., below 1000 psi and, preferably, below 500 psi).

A major advantage of using a NPM to package the above-described structures is that the NPM technology is substantially less expensive than the laser welding technology that is currently used to seal optical and photonics components in packages such as, but not limited to, butterfly packages. More specifically, the equipment needed to form NPM-based seals is substantially less expensive than laser welding equipment and the actual process of forming a NPM seal is typically substantially less expensive than the process for sealing a package via laser welding as well.

In order to make or manufacture an optical or photonics device that includes a NPM, a variety of methods are available. According to one exemplary method, an optical or photonics device is formed or positioned in an enclosure that includes an opening. Then, a lid is placed on the opening and a hermetic seal is formed between the lid and the enclosure.

Micro-Electro-Mechanical System (MEMS) Devices

The above-disclosed materials, layers, and methods, and variations thereof, may be used in the manufacture of MEMS devices. According to certain embodiments, NPMs provide hermetic seals for MEMS device structures. Also, NPMs can reduce internal stresses in MEMS devices (e.g., NPMs can protect a MEMS structure or assembly both from the effects of elevated pressure and bow). Further, NPMs can be used for minimizing the height or thickness of MEMS devices.

According to certain embodiments of the present invention, a micro-fabricated structure, typically in the form of a packaged or protected MEMS structure or display structure, includes a substrate that has a free surface. When the structure is a MEMS structure, the substrate typically includes a ceramic material.

A micro-fabricated device (e.g., a MEMS device or a display device) is positioned or fabricated on this free surface of the substrate. Then, an intermediate layer (e.g., a ring or other structure that protrudes from the substrate) with a first surface and a second surface is formed or placed on the free surface, thereby substantially surrounding the micro-fabricated device. A first surface of the intermediate layer is typically positioned adjacent to the free surface of the substrate and a second surface of the intermediate layer is typically positioned opposite the first surface of the intermediate layer.

According to certain embodiments of the present invention, once the intermediate layer is in position around the MEMS device, a cover is positioned adjacent to the second surface of the intermediate layer. This cover, separated from the substrate by the intermediate layer and, preferably, is made from an optically transparent material that allows for optical monitoring of the micro-fabricated device while the device is in operation. In other words, the moving portion of the MEMS device under the cover can be viewed from above the cover without removing the cover.

According to certain embodiments, a first nano-particle material layer is positioned between the cover and the second surface of the intermediate layer. This first nano-particle material layer typically forms a hermetic seal between the cover and the intermediate layer. Also, if desired, the first nano-particle material layer may be designed to be capable of absorbing moisture from surfaces, which the first nano-particle material layer contacts.

As previously stated, there is a premium placed on designing structures with minimum possible heights. In view of this premium, according to certain embodiments of the present invention, the first nano-particle material layer may be formed to have a thickness of less than approximately 10 microns. According to other embodiments, the first nano-particle material layer is formed to have a thickness of approximately 1 micron. Even with such relatively thin NPM layers, adhesion between the cover and the intermediate layer is maintained, as is the hermeticity of the seal formed by the NPM layer. This is a considerable improvement over the related-art epoxies, which cannot be deposited in continuous layers that are thinner than approximately 1 mil (i.e., 25 microns) and that are typically formed with thicknesses of between 1 and 2 mils. Also, NPM adhesion layers have an advantage over epoxies in that NPM layers are very effective in binding smooth (e.g.,.polished) surfaces together.

In addition to the components listed above, certain embodiments of the present invention include a second NPM layer that is positioned between the substrate and the first surface of the intermediate layer. This second NPM layer typically forms a hermetic seal between the cover and the intermediate layer. In addition, this second NPM layer typically is capable of absorbing moisture from surfaces, which the second nano-particle material layer contacts. Further, like the first NPM layer, the second NPM layer may have a thickness of less than approximately 10 microns and, under certain circumstances, may have a thickness of approximately 1 micron while retaining its adhesive and hermetic properties.

One representative method of forming the above-described MEMS micro-fabricated structures includes micro-fabricating a device (e.g., a MEMS device that includes a movable portion) on a substrate that structurally supports the device. This method also includes micro-fabricating or positioning an intermediate layer to substantially surround the device. For example, a ring may be positioned around the device or the intermediate layer may have been etched in the substrate before or at the same time that the MEMS device was formed.

The representative method then includes micro-fabricating or positioning a cover in directs contact with or adjacent to the intermediate layer. At that point, the micro-fabricated device is hermetically sealed in a cavity defined by the substrate, the intermediate layer, and the cover. In other words, the device is hermetically sealed between these components. According to certain embodiments of the present invention, the hermetically sealing step includes using a first nano-particle material layer to attach the cover to the intermediate layer. The hermetically sealing step may also include using a second NPM layer to attach the intermediate layer to the substrate.

Displays

The above-disclosed materials, layers, and methods, and variations thereof, may be used in the manufacture of display structures. NPMs typically provide the same types of benefits for display structures as they do for MEMS structures. However, a few differences between these two types of micro-fabricated structures are discussed below.

NPMs can be effectively used in display structures in which high hermeticity, low internal stress levels, and/or low expansion is highly preferred. The coefficient of thermal expansion (CTE) of a representative NPM, because the NPM may be loaded with low expansion particles (e.g., silica), is significantly lower than the CTE of the conventional adhesives, such as epoxies, which are currently used in the related art. In addition, NPMs typically have very low Young's moduli, good adhesive strengths, thyxotropic properties (that result in the NPM self-healing ability, as well as in its ability to "arrest" cracks in the adjacent materials), and strongly pronounced hydrophobicities. Hence, NPMs are very attractive for application in display structures of any type when high reliability, very low displacements and small thicknesses of the adhesive and/or the coating layer are often required.

As alluded to above, in some respects, displays are similar to MEMS devices and benefit from NPMs in substantially the same way as MEMS devices do. Hence, the structures and methods discussed above with relation to MEMS devices are generally applicable to displays as well.

However, display devices are generally capable of light-emission, typically do not have moving parts, and are typically larger and could be much thinner than MEMS devices. For example, while a representative protruding structure or ring in a MEMS device may have a diameter on the order of 4 millimeters, a representative protruding structure or ring in a rigid or a flexible display may have an outer diameter on the order of 100 millimeters and an interior diameter on the order of 80 millimeters. At least in view of the above, the materials which may be used for displays can be somewhat different from materials used for MEMS devices.

For example, since a display is preferably viewed from above and below the substrate, optically transparent substrate materials are desirable. Hence, in conjunction with the above-described optically-transparent covers an optically-transparent plastic or glass substrate is commonly used. According to other embodiments, the above-discussed intermediate layer also comprises an optically-transparent material.

Other Possible Applications

In addition to the optical fibers, IC devices, photonics packages, MEMS devices, and displays discussed in detail above, NPM materials, layers, and methods, and variations thereof, may be used in the manufacture of, or in conjunction with, almost any items that would benefit from the properties of NPMs. For example, any item that would benefit from the use of a material with hermetic properties and enhanced mechanical properties is within the scope of the present invention.

In addition to the above applications, the NPM-based materials can be used to reduce hydrodynamic and/or aerodynamic drag for bodies/vehicles moving in water or air. The NPM-material can be used as a separate layer and/or can be applied as an additive to regular paints (e.g., those used to prevent corrosion, barnacle growth, etc.) or advanced paints (e.g., self-polishing paints). Because of the small size of the particles in a NPM, the material has a self-healing ability. The material also has improved chemical, mechanical, and environmental properties and can considerably reduce friction on at least a portion of a vehicle. The NPM material can be used for large ships, small vessels, sports boats, etc.

In a very general sense, a NPM may be used as a sealing/coating material and/or as a drag reducing material (additive) on any item that has a surface made of either a metal or a non-metal. For example, the surfaces of such items as metallic and non-metallic tubes, pipes, and pipelines may be coated with NPMs. Also, metallic and non-metallic surfaces of cars, bridges, buildings, aircraft, aerospace structures, offshore and ocean structures, marine vehicles (e.g., ships), and underground structures (including those used in engineering barrier systems in mines, and repositories) may be coated with NPMs. Further, general-purpose plastic and/or cardboard packages used in the food and/or pharmaceutical industry (e.g., those packages used to protect perishable consumer goods) may be coated with NPMs. If desired, the NPMs may be applied on either a permanent or temporary basis (i.e., the NPM may be designed such that it may be washed off or otherwise removed). As a final representative example, NPMs may be used to coat non-optical fibers that are used to reinforce structures or plastics.

In order to form a coating that protects a macroscopic surface, any of the above-described methods for forming NPMs may be used, as well as any other method that will become apparent to one skilled in the art pursuant to reading this disclosure. However, according to one embodiment, the coating may be formed by preparing a NPM and then depositing the NPM on the surface via a method such as, but not limited to, spraying or painting.

In alternate embodiments, NPMs may also be used in special medical devices (e.g., drug-delivery patches) where a high degree of penetration is necessary. According to these embodiments, the small size of the nano-particles included in NPMs and the ability of those nano-particles to migrate into very small openings is capitalized upon. For example, according to certain embodiments of the present invention, a medical drug is attached to nano-particles in a NPM. Then, the drug-laden NPM is included in a patch that may be placed on the skin a patient. Once placed on the patient's skin, the nano-particles in the patch travel through the patient's skin, thereby delivering the medical drug to the patient without requiring a painful injection.

According to certain embodiments of the present invention, a NPM is used in conjunction with a material that has a greater resistance to mechanical forces than the NPM does. For example, a NPM may be deposited on the surface of a bridge and an acrylic (e.g., acrylic paint) may be used to coat the surface and the NPM, thereby securing the NPM to the surface. Since NPMs have a practically infinite lifetime, the surface may be indefinitely protected from corrosion so long as the acrylic secures the NPM to the surface.

While the invention has been described in detail and with reference to specific embodiments thereof, it will be apparent to those skilled in the art that various changes and modifications can be made therein without departing from the spirit and scope thereof. Thus, it is intended that the present invention covers the modifications and variations of this invention provided they come within the scope of the appended claims and their equivalents.

What is claimed is:

1. A packaged electronic device, comprising:
    a substrate with a first surface having an integrated circuit thereon; and
    a nano-particle material adjacent to the first surface.
2. The device of claim 1, wherein the nano-particle material forms a layer contacting the first surface.
3. The device of claim 1, further comprising a polymer packaging layer contacting the first surface.
4. The device of claim 3, wherein the nano-particle material is incorporated into the packaging layer.
5. The device of claim 3, wherein the packaging layer is between the first surface and the nano-particle material.
6. The device of claim 1, wherein the nano-particle material is thixotropic.

7. An optical device comprising:
an enclosure with an opening;
a photonic device within the enclosure;
a lid covering the opening; and
a nano-particle material between the lid and the enclosure.

8. The optical device of claim 7, wherein the nano-particle material provides a hermetic seal between the enclosure and the lid.

9. The optical device of claim 8, wherein the nano-particle material allows for relative motion between the lid and the cover while maintaining the hermetic seal.

10. The optical device of claim 7, wherein the nano-particle material comprises a material with a low Young's Modulus.

11. The device of claim 7, wherein the nano-particle material is thixotropic.

12. A micro-fabricated structure, comprising:
a substrate having a first surface;
a micro-fabricated device positioned on the first surface of the substrate;
an intermediate layer with a first surface and a second surface, wherein the first surface of the intermediate layer is opposite the second surface of the intermediate layer, wherein the first surface of the intermediate layer is positioned adjacent to the first surface of the substrate, and wherein the intermediate layer substantially surrounds the device; and
a first nano-particle material layer that forms a hermetic seal between the substrate and the intermediate layer.

13. The micro-fabricated structure of claim 12 wherein the first nano-particle material layer is capable of absorbing moisture from surfaces it contacts.

14. The micro-fabricated structure of claim 12, further comprising a second nano-particle layer positioned between the substrate and the first surface of the intermediate layer.

15. The micro-fabricated structure of claim 12, wherein the substrate comprises any of a ceramic material, and an optically transparent material.

16. The micro-fabricated structure of claim 12, wherein the intermediate layer comprises an optically transparent material.

17. The device of claim 12, wherein the first nano-particle material layer is thixotropic.

* * * * *